(12) United States Patent
Shepard et al.

(10) Patent No.: US 10,130,008 B2
(45) Date of Patent: Nov. 13, 2018

(54) IMMERSION COOLING SYSTEMS AND METHODS

(71) Applicant: Hamilton Sundstrand Corporation, Charlotte, NC (US)

(72) Inventors: Charles Shepard, DeKalb, IL (US); Kris H. Campbell, Poplar Grove, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 15/090,236

(22) Filed: Apr. 4, 2016

(65) Prior Publication Data

US 2017/0290198 A1 Oct. 5, 2017

(51) Int. Cl.
*H05K 7/20* (2006.01)
*H01L 23/44* (2006.01)

(52) U.S. Cl.
CPC ......... *H05K 7/20236* (2013.01); *H01L 23/44* (2013.01); *H05K 7/203* (2013.01); *H05K 7/20281* (2013.01); *H05K 7/20381* (2013.01); *H05K 7/20872* (2013.01); *H05K 7/20881* (2013.01); *H05K 7/20927* (2013.01); *H05K 7/20936* (2013.01); *H05K 7/20945* (2013.01)

(58) Field of Classification Search
CPC .............. H05K 7/20236; H05K 7/203; H05K 7/20872–7/20881; H05K 7/20927–7/20936; H01L 23/46; H01L 23/473
USPC .......... 361/699–700; 165/80.4–80.5, 104.33; 257/714; 174/547–548
See application file for complete search history.

(56) References Cited

U.S. PATENT DOCUMENTS

| | | | |
|---|---|---|---|
| 5,035,121 A * | 7/1991 | Cook | B67D 1/10 222/146.6 |
| 6,938,678 B1 | 9/2005 | Bortolini et al. | |
| 7,055,581 B1 * | 6/2006 | Roy | H01L 23/427 165/104.21 |
| 7,092,254 B1 | 8/2006 | Monsef et al. | |
| 8,490,679 B2 * | 7/2013 | Campbell | F28D 15/02 165/104.21 |
| 9,464,854 B2 * | 10/2016 | Shelnutt | F28F 27/02 |
| 2006/0007656 A1 * | 1/2006 | Symons | H01L 23/473 361/699 |

(Continued)

FOREIGN PATENT DOCUMENTS

| | | |
|---|---|---|
| EP | 1748688 A2 | 1/2007 |
| EP | 2341119 A1 | 7/2011 |
| JP | 2006216806 A | 8/2006 |

OTHER PUBLICATIONS

Extended European Search Report from the European Patent Office dated Sep. 1, 2017, for Application No. 17164795.1.

*Primary Examiner* — Dion R Ferguson
*Assistant Examiner* — Amir Jalali
(74) *Attorney, Agent, or Firm* — Locke Lord LLP; Scott D. Wofsy; Christopher J. Cillie (57) ABSTRACT

An immersion cooled electronic arrangement includes a sealed housing, a coolant contained within the housing, and an electronic device submerged within the coolant. An agitator is disposed within the housing to control passive heat transfer between the electronic device and the coolant. An immersion cooling system and related method are also described.

17 Claims, 4 Drawing Sheets

(56) References Cited

U.S. PATENT DOCUMENTS

| | | | |
|---|---|---|---|
| 2007/0025081 A1* | 2/2007 | Berlin | H01L 23/44 |
| | | | 361/698 |
| 2010/0031403 A1 | 2/2010 | Leuschner et al. | |
| 2010/0254087 A1* | 10/2010 | Godfroy | H05K 5/06 |
| | | | 361/699 |
| 2010/0263838 A1 | 10/2010 | Mahalingam et al. | |
| 2010/0328889 A1 | 12/2010 | Campbell et al. | |
| 2011/0140820 A1* | 6/2011 | Guentert, III | H01F 27/12 |
| | | | 336/58 |
| 2012/0145361 A1* | 6/2012 | Glezer | F28F 13/00 |
| | | | 165/109.1 |
| 2013/0068606 A1* | 3/2013 | Lahnstein | B01F 7/00241 |
| | | | 202/175 |
| 2013/0091868 A1* | 4/2013 | Campbell | F25B 21/02 |
| | | | 62/3.2 |
| 2014/0355212 A1* | 12/2014 | Campbell | H05K 7/20236 |
| | | | 361/699 |
| 2016/0286694 A1* | 9/2016 | Krishnan | H05K 7/20772 |
| 2016/0307685 A1* | 10/2016 | White | H01F 27/18 |
| 2016/0360606 A1* | 12/2016 | Saeidi | H05K 1/0203 |

* cited by examiner

IMMERSION COOLING SYSTEMS AND METHODS

BACKGROUND OF THE INVENTION

1. Field of the Invention

The present disclosure relates to electrical systems, and more particularly to heat removal from electronics in electrical systems.

2. Description of Related Art

Throughout the aerospace industry the electrical power requirements of modern equipment is steadily increasing. These increased power requirements, in conjunction with the harsh operating environments aerospace products generally experience, create a demand for electrical system components with higher power densities. Electrical system components with higher power densities consume greater amounts of the electrical power, and therefore can require increased cooling provisioning and cooling control in order to ensure reliable operation of the electrical system components.

Several cooling techniques may be employed in electronic equipment to remove heat from electrical systems. For example, conduction cooling, natural convection cooling, radiation cooling, forced-air cooling, and liquid cooling can generally satisfactorily remove heat from electrical systems. Immersion cooling, which typically places heat-generating components in direct contact with a liquid, can also be employed for cooling electrical systems. Such cooling arrangements can be influenced by vibration received from the external environment due to the localized phase change that can occur between the liquid and heat-generating component.

Such conventional methods and systems have generally been considered satisfactory for their intended purpose. However, there is still a need in the art for improved immersion cooling systems. The present disclosure provides a solution for this need.

SUMMARY OF THE INVENTION

An immersion cooled electronic arrangement includes a sealed housing, a coolant contained within the housing, and an electronic device submerged within the coolant. An agitator is disposed within the housing to control passive heat transfer between the electronic device and the coolant.

In certain embodiments, the coolant can include a dielectric coolant. The agitator can include a vibratory agitator. The agitator can be submerged within the coolant. The agitator can include a substrate. The substrate can be fixed relative to the housing. The agitator can include an actuated element. The actuated element can be movable between a first position and a second position, the first and second position defining a movement axis. The movement axis can intersect the electronic device. The agitator can include an actuator. The actuator can be coupled between the actuated element and the substrate. The actuator can be adapted and configured to displace coolant by moving the actuated element between the first and second positions along the movement axis.

In accordance with certain embodiments, the actuated element can be a first actuated element, and the actuator can include a second actuated element. The second actuated element can disposed below the first actuated element relative to gravity. The second actuated element can be separated from the first actuated element. The second actuated element can be independently movable relative to the first actuated element. The actuator can be a first actuator, and the agitator can include a second actuator. The first actuator can be coupled between the substrate and the first actuated element and the second actuator can be coupled between the substrate and the second actuated element for displacing the second actuated element relative to the first actuated element.

In accordance with certain embodiments, the electronic device can include a power converter or motor controller. The electronic device can include a printed circuit board (PCB) assembly. The PCB assembly can be separated from the agitator by the coolant-filled gap. One or more solid-state switch devices, such as a field effect transistor (MOSFET) and/or an insulated gate bipolar transistor (IGBT) can be connected to the PCB. A heat sink can be coupled to the PCB.

It is also contemplated that, in accordance with certain embodiments, the housing the coolant can define therebetween an ullage space. A condenser can be connected to the housing and disposed within the ullage space. The immersion cooled electronic arrangement can include a heat sink, and the heat sink can be connected to housing on a side of the ullage space opposite the coolant. The coolant-filled gap can extend vertically between electronic device and the agitator, and towards the ullage space. The immersion cooled electronic arrangement can include a controller, and the controller can be operatively connected to the agitator. A sensor can be coupled to the electronic device and can be communicative with the controller. The sensor can include an accelerometer, a temperature transducer, and/or a pressure transducer.

An immersion cooling system includes an immersion cooling arrangement as described above and a control module. The control module is operatively connected to the agitator and is responsive to instructions recorded on a non-transitory, machine-readable medium to execute instructions recorded on the memory in one or more program modules. The instructions cause the agitator to control passive heat transfer between the electronic device and the coolant.

In certain embodiments, the instructions can cause the control module to determine a heat transfer coefficient between electronic device and the coolant, compare the determined heat transfer coefficient with a predetermined heat transfer coefficient, and actuate the agitator based on the comparison of the determined heat transfer coefficient and the predetermined heat transfer coefficient. In accordance with certain embodiments, the instructions can cause the control module to determine heat flux between the electronic device and the coolant, compare the determined heat flux with a predetermined heat flux value, and actuate the agitator based on the comparison of the determined heat flux and the predetermined heat flux value.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
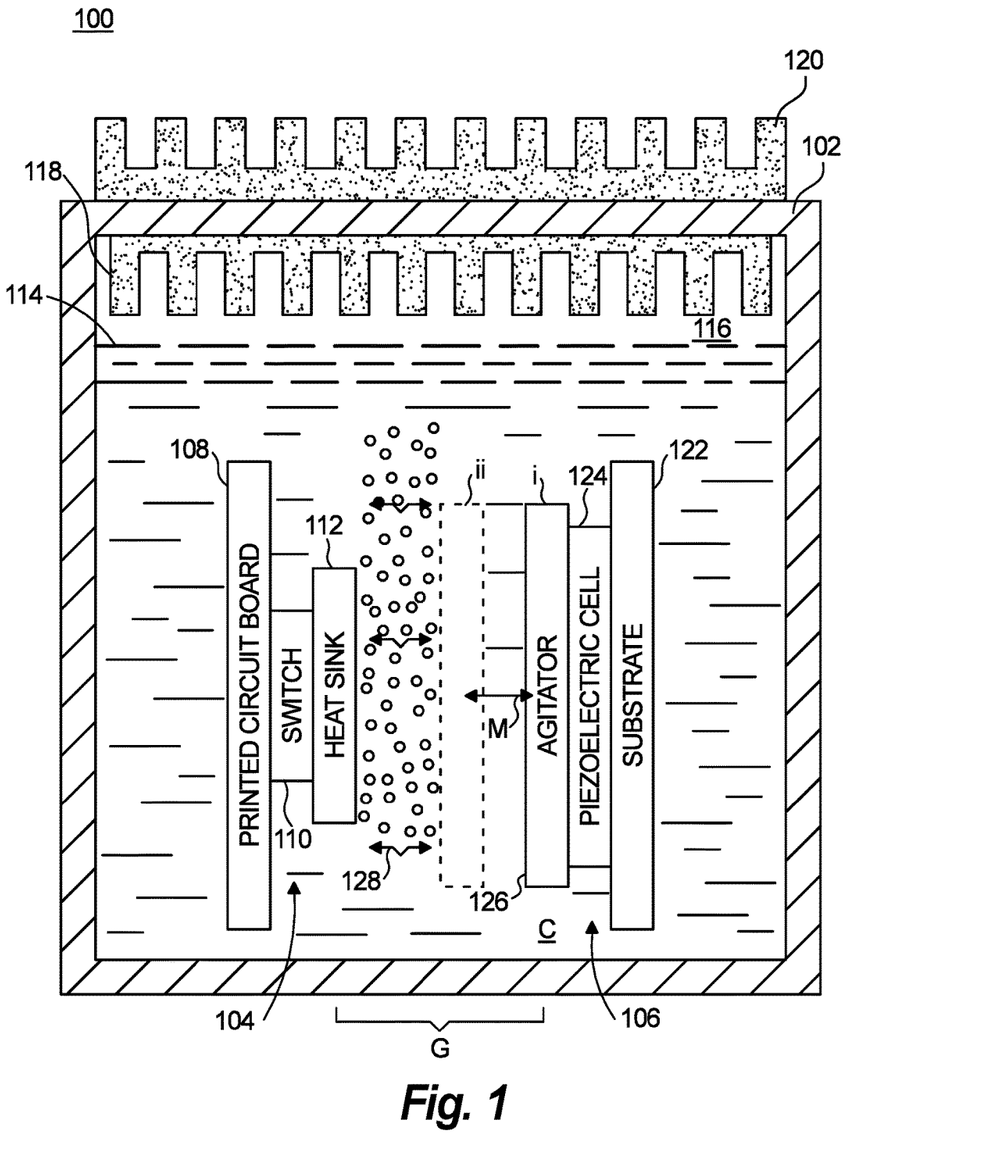
FIG. 1 is a schematic view of an exemplary embodiment of an immersion cooled electronic arrangement constructed in accordance with the present disclosure, showing an electronic device and an agitator submerged within a coolant.

Reference will now be made to the drawings wherein like reference numerals identify similar structural features or aspects of the subject disclosure. For purposes of explanation and illustration, and not limitation, a partial view of an exemplary embodiment of an immersion cooled electronic arrangement in accordance with the disclosure is shown in FIG. 1 and is designated generally by reference character 100. Other embodiments of immersion cooling arrangements, systems, and method of controlling heat transfer in immersion cooling arrangements and systems, are provided in FIGS. 2-4, as will be described. The arrangements, systems, and methods described herein can be used removing heat from power converters and/or motor controllers for vehicular electrical systems, though the present disclosure is not limited power converters, motor controllers, or to vehicular electrical systems in general.

Referring to FIG. 1, immersion cooled electronic arrangement 100 is shown. Immersion cooled electronic arrangement 100 includes a sealed housing 102, a coolant C contained within housing 102, and an electronic device 104 submerged within coolant C. An agitator 106 is disposed within housing 102 and is separated from electronic device 104 by a coolant-filled gap G defined between electronic device 104 and agitator 106. Agitator 106 is adapted and configured to displace coolant within gap G, thereby controlling heat transfer between electronic device 104 and coolant C.

Coolant C is electrically insulative, thermally conductive, liquid, and may include a dielectric coolant. Examples of suitable coolants include fluids containing perfluorohexane (FC-72), perfluoro (FC-75), and/or perfluorotripentylamine (FC-70). FC-72, FC-75, and FC-70 are available under the tradename Flourinert® by the 3M Company of Maplewood, Minn.

A liquid phase portion of coolant C is disposed within a lower (relative to gravity) portion of the interior of housing 102, and is bounded by a liquid surface 114 located in an upper (relative to gravity) portion of the interior of housing 102. An ullage space 116 is defined within the interior of housing 102 between liquid surface 114 and the upper (relative to gravity) interior surface of housing 102, ullage space 116 containing a portion of coolant C in a vapor or gaseous phase. As will be appreciated by those of skill in the art in view of the present disclosure, the portion of liquid phase to vapor phase of coolant C within interior 102 varies according to heat generated by components submerged within coolant C.

A condenser 118 is disposed within ullage space 116. Condenser 118 is in thermal communication with a heat exchanger 120 through housing 102, heat exchanger 120 being disposed on an exterior of housing 102. Condenser 118 and heat exchanger 120 each have a plurality of fins for purposes of providing increased surface area for heat transfer, and as illustrated include discrete finned bodies connected to housing 102. As will be appreciated by those of skill in the art, either or both of condenser 118 and heat exchanger 120 may be defined by housing 102, such as by fins defined by one or more interior and/or exterior surfaces of the walls of housing 102.

In the illustrated exemplary embodiment, electronic device 104 includes a printed circuit board (PCB) 108, a solid-state switch device 110, and a heat sink 112. PCB 108 is oriented vertically (relative to gravity) within housing 102. Solid-state switch device 110 is connected to a surface of PCB 108 facing agitator 106, and may include a field effect transistor device like a MOSFET or an insulated gate bipolar transistor (IGBT) device for a power converter system. Heat sink 112 is connected to solid-state switch device 110 and on a side of solid-state switch device 110 facing agitator 106 for increasing the rate of heat transfer from solid-state switch device 110. Each component of electronic device 104, i.e. PCB 108, solid-state switch device 110, and heat sink, are submerged within coolant C. It is contemplated that agitator 106 can include a vibratory agitator.

Agitator 106 is submerged within coolant C and includes a substrate 122, an actuator 124, and an actuated element 126. Substrate 122 is fixed relative to housing 102 and extends vertically (relative to gravity) within the interior of housing 102. Actuator 124 is connected to substrate 122, extends laterally therefrom towards electronic device 104, and in the illustrated exemplary embodiment includes a piezoelectric element that is responsive input voltage to displace actuated element 126 relative to substrate 122. Actuated element 126 is operably connected to actuator 124 and is movable between a first position (i) and a second position (ii). First position (i) is proximate substrate 122; second position (ii) is proximate electronic device 104. First position (i) and second position (ii) are disposed along a movement axis M that intersects solid-state switch device 110. As will be appreciated, movement of actuated element 126 toward solid-state switch device 110 displaces a portion of coolant C (shown with arrows 128), influencing heat transfer between electronic device 104 and coolant C.

As will be appreciated by those of skill in the art, energized electronic components, e.g., solid-state switch device 110, can generate significant amounts of heat during operation. In certain applications, like vehicular electrical systems, the amount of heat generated by such electronic components can vary according to the duty cycle of the electronic component. In the context of immersion cooled electronic devices, heat transfer can also vary according to the heat transfer coefficient and critical heat flux between the electronic component and the coolant. The heat transfer coefficient and critical heat flux between the electronic component and coolant in turn can be influenced by external factors, such as vibrations received by the immersion cooled electronic arrangement from the external environment.

Agitator 106 is configured to counteract the effects of such vibration on the arrangement. In particular, actuator 124 is configured to displace actuated element 126, thereby displacing coolant portions within housing 102, and either inducing vibration therein or cancelling vibration induced from the external environment. Since vibration of electronic device 104 tends to increase the heat transfer coefficient between electronic device 104 and coolant C, and decrease the critical heat flux between the electronic device 104 and coolant C, displacing actuated element 126 allows for controlling the heat transfer coefficient and critical heat flux. This expands the operating window of electronic device 104, potentially to operating conditions where the device could otherwise experience thermal runaway.

Figure 2:
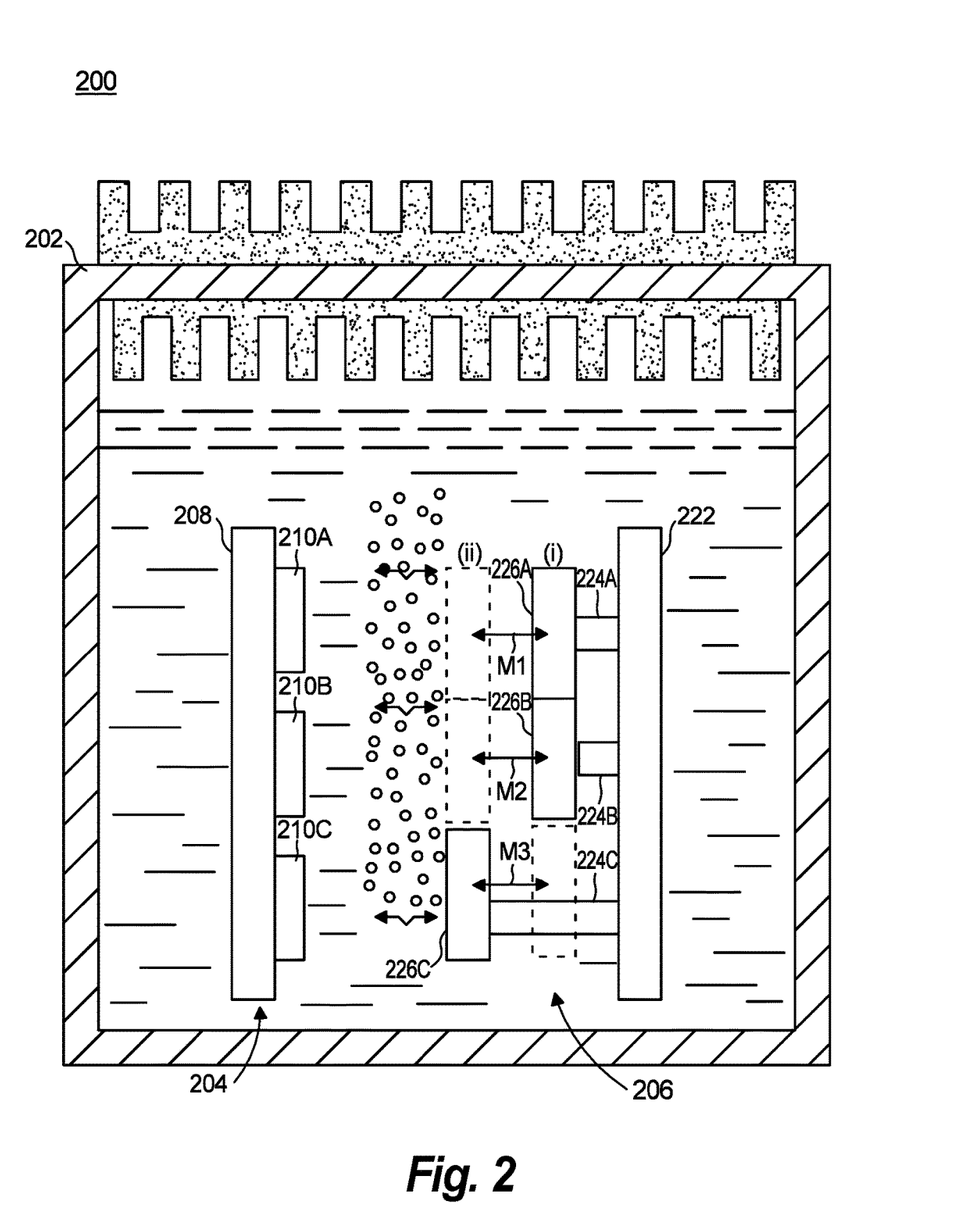
FIG. 2 is a schematic view of second embodiment of an immersion cooled electronic arrangement constructed in accordance with the present disclosure, showing an electronic device and a segmented agitator submerged within a coolant.

With reference to FIG. 2, an immersion cooled electronic arrangement 200 is shown. Immersion cooled electronic arrangement 200 is similar to immersion cooled electronic arrangement 100, and additionally includes a segmented agitator 206 and an electronic assembly 204. Electronic assembly 204 has a first solid-state switch device 210A, a second solid-state switch device 210B, and third solid-state switch device 210C that each coupled to a PCB 208 and arranged vertically within sealed housing 202.

Segmented agitator 206 includes an actuated element array and an actuator array. In this respect segmented agitator 206 includes a first actuated element 226A and a second actuated element 226B. First actuated element 226A and second actuated element 226B are both displaceably coupled to a substrate 222 along movement axes to electronic assembly 204 between first and second positions. Second actuated element 226B is disposed below (relative to gravity) first actuated element 226A within sealed housing 202 in correspondence to the arrangement of the solid-state switch devices. The respective first and second positions of each actuated element define a first movement axis $M_1$ and a second movement axis $M_2$, first movement axis $M_1$ intersecting a different solid-state switch device than that intersecting second movement axis $M_2$. As will be appreciated by those of skill in the art by those of skill in the art in view of the present disclosure, this arrangement allows for selectively displacing coolant proximate different electrical components according to the needs of the respective electrical device, such as according to the tendency of different device to 'ring' in response to input vibration and/or according to the duty cycle of a respective electronic device.

Differential actuation of the actuated elements may be, by way of non-limiting illustration, through the actuator array, wherein a first actuator 224A is operably connected to a first actuated element 226A (i.e. coupled between substrate 222 and first actuated element 226A), a second actuator 224B is operably connected to a second actuated element 226B (i.e. coupled between substrate 222 and second actuated element 226B), and a third actuator 224C is operably connected to a third actuated element 226C (i.e. coupled between substrate 222 and third actuated element 226C) for independent displacement of the respective actuated elements along actuated element movement axes, e.g., $M_1$-$M_3$, relative to substrate 222 between first position (i) and second position (ii). This selectively displaces coolant proximate individual heat-generating components, for example by displacing coolant proximate third solid-state switch device 210C differently than coolant proximate second solid-state switch device 210B in a way that corresponds to differences in the switching cycle of the respective switch device.

Figure 3:
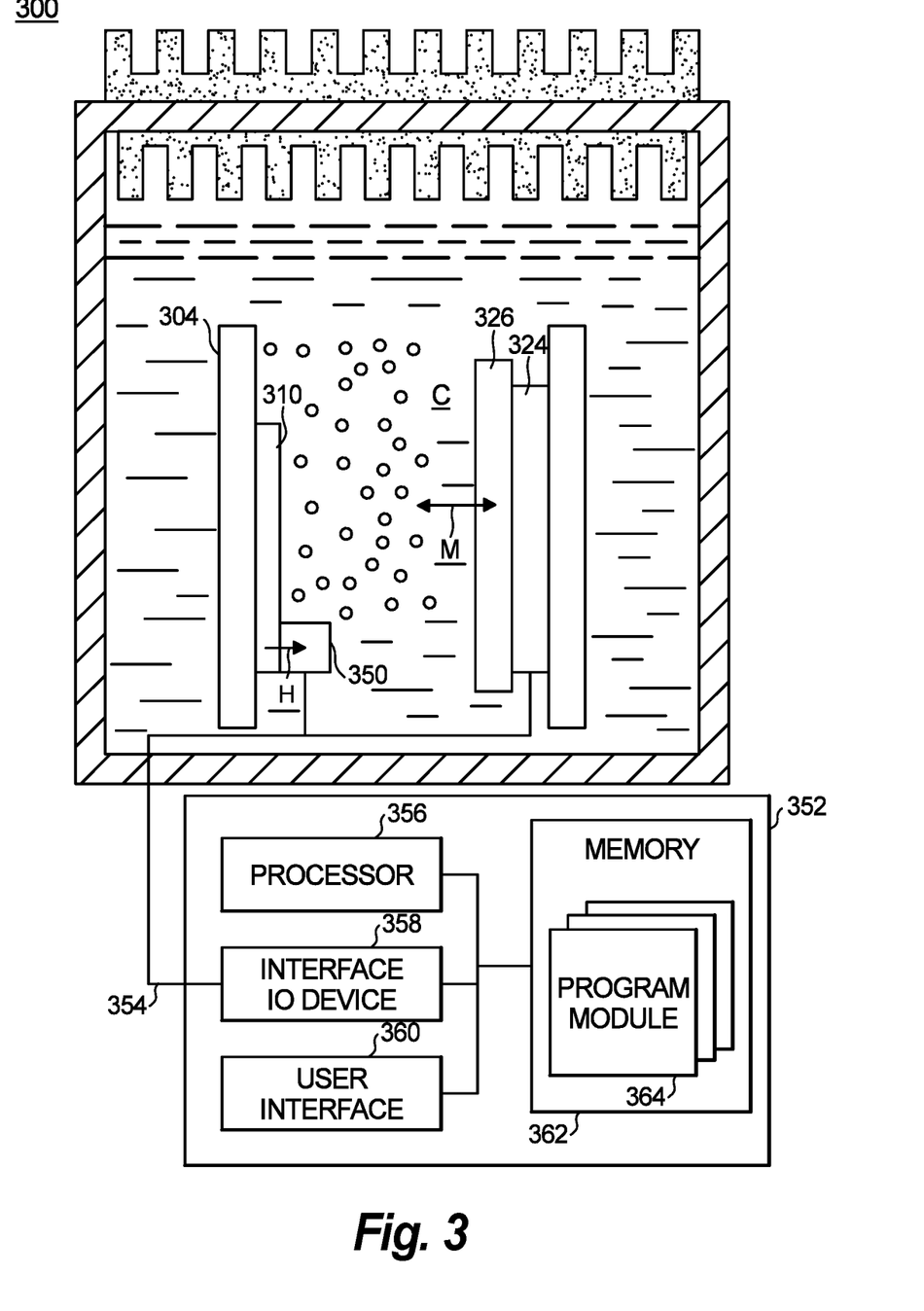
FIG. 3 is a schematic view of another embodiment of an immersion cooled electronic arrangement constructed in accordance with the present disclosure, showing a control module operatively associated with segments of a segmented agitator.

With reference to FIG. 3, an immersion cooled electronic arrangement 300 is shown. Immersion cooled electronic arrangement 300 is similar to immersion cooled electronic arrangement 100 (shown in FIG. 1) and immersion cooled electronic arrangement 200 (shown in FIG. 2), and additionally includes a sensor 350 and a control module 352. Sensor 350 is configured to receive an input from PCB 304 and/or solid-state switch 310, such as heat H, and can include one or more of a temperature transducer, a pressure transducer, an accelerometer, or any other suitable device for determining heat flux between the electronic device and coolant C. Sensor 350 is communicative with control module 352 through a link 354, which may a wired or wireless link, to provide data relating to the heat transfer coefficient and/or the critical heat flux between PCB 304 and coolant C.

Control module 352 includes a processor 356, an input/output device 358, a user interface 360, and a memory 362 that are each connected to link 354 through input/output device 358 and are communicative with one another therethrough. Memory 362 is a non-transitory, machine-readable memory having one or more program modules 364 recorded thereon. The one or more program modules 364 have instructions recorded thereon that, when read by processor 356, cause control module 352 to execute certain actions. In this respect the instruction cause control module to actuate actuator 324 as described above, i.e. by causing actuator 324 to displace actuated element 326 along movement axis M. In this respect actuation may be blind, i.e. without input from sensor 350. Actuation may be smart, e.g., based upon input from sensor 350. It is contemplated that actuation may be based upon a determined heat transfer coefficient and critical heat flux between electronic device 104 and coolant C. It is also contemplated that actuation may be based upon a comparison of the determined the heat transfer coefficient and critical heat flux between electronic device 104 and coolant C with predetermined values stored in program modules 364. Although described in relation to immersion cooled electronic arrangement 100 (shown in FIG. 1), it is to be understood and appreciated that control module 352 may also be adapted and configured to independently displace multiple actuated elements, such as those of immersion cooled electronic arrangement 200 (shown in FIG. 2).

Figure 4:
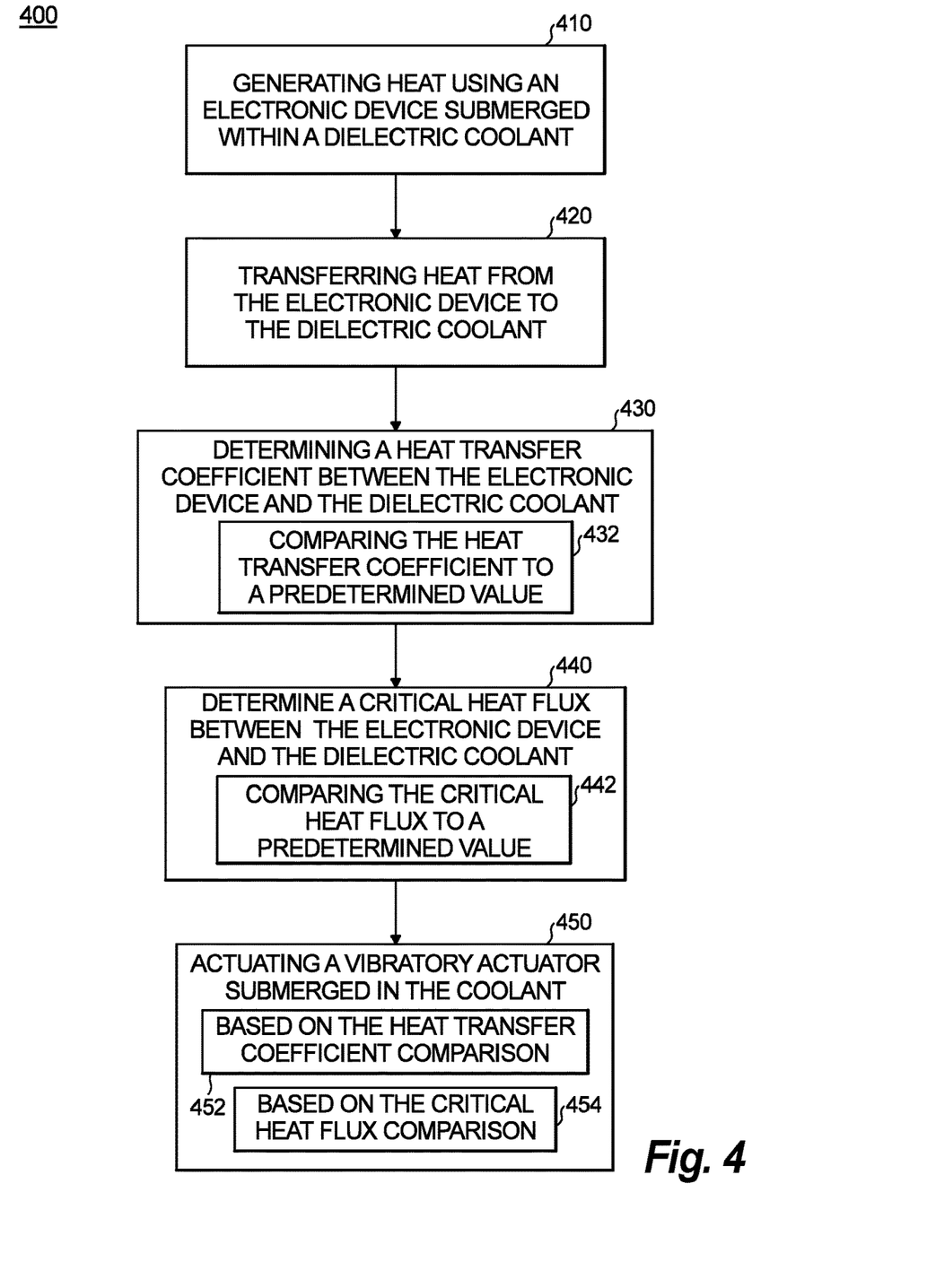
FIG. 4 is a diagram of a method of controlling heat transfer in an immersion cooling assembly, showing steps of the method.

With reference to FIG. 4, a method 400 of controlling heat transfer between an electronic device and a coolant in an immersion cooling assembly is shown. Method 400 includes generating heat using an electronic device submerged within coolant disposed within a sealed housing, as shown with box 410. Method 400 also includes transferring the heat from the electronic device to the coolant, as shown with box 420. An agitator submerged within the coolant and separated from the electronic device by a coolant-filled gap is actuated according to heat transfer between the electronic device and the coolant to control heat transfer between the electronic device and the coolant, as shown with box 450.

Method 400 can also include determining a heat transfer coefficient between electronic device and the coolant, as shown with box 430, and comparing the determined heat transfer coefficient with a predetermined heat transfer coefficient, as shown with box 432. Actuating the agitator can be based on the determined heat transfer coefficient and/or a comparison of the determined heat transfer coefficient with a predetermined heat transfer coefficient, as shown with box 452.

Alternatively or additionally, method 400 can include determining heat flux between the electronic device and the coolant, as shown with box 440, and comparing the determined heat flux with a predetermined heat flux value, as shown with box 442. Actuating the actuator can be based on the determined critical heat flux and/or a comparison of the comparison of the determined heat flux and the predetermined heat flux value, as shown with box 454. The agitator can be actuated when a heat transfer coefficient between the electronic device and coolant falls below a predetermined value. The agitator can be actuated when heat flux between the electronic device and coolant is above a predetermined value. In certain embodiments, the agitator can be actuated at a rate to drive either the heat transfer coefficient or the heat flux to a target value. In accordance with certain embodiment, actuating the agitator can increase the rate at which liquid coolant undergoes a liquid to vapor phase change in proximity to surface of the electronic device.

As will be appreciated by those skilled in the art, aspects of the present disclosure may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "device," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 3 is intended to provide a brief, general description of an illustrative and/or suitable exemplary environment in which embodiments of the above described present invention may be implemented. FIG. 3 is exemplary of a suitable environment and is not intended to suggest any limitation as to the structure, scope of use, or functionality of an embodiment of the present invention. A particular environment should not be interpreted as having any dependency or requirement relating to any one or combination of components illustrated in an exemplary operating environment. For example, in certain instances, one or more elements of an environment may be deemed not necessary and omitted. In other instances, one or more other elements may be deemed necessary and added.

The methods and systems of the present disclosure, as described above and shown in the drawings, provide for immersion cooled electronic devices with superior properties including improved control of heat transfer within electronic devices and coolant within sealed immersion cooling environments. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An immersion cooled electronic arrangement, comprising:
   a sealed housing;
   a coolant contained within the housing;
   an electronic device submerged within the coolant;
   an agitator disposed within the housing;
   a control module operatively connected to the agitator, the agitator is configured to control heat transfer between the electronic device and the coolant, the control module being responsive to non-transitory machine-readable instructions to control heat transfer between the electronic device and the coolant; and
   a sensor disposed within the housing, the sensor being adapted and configured to provide a signal including information relating to a heat transfer coefficient and critical heat flux between the electronic device and the coolant,
   wherein the instructions cause the control module to:
      determine a heat transfer coefficient between the electronic device and the coolant;
      compare the determined heat transfer coefficient with a predetermined heat transfer coefficient; and
      actuate the agitator based on the comparison of the determined heat transfer coefficient and the predetermined heat transfer coefficient.

2. The immersion cooled electronic arrangement as recited in claim 1, wherein the agitator comprises a substrate fixed relative to the housing.

3. The immersion cooled electronic arrangement as recited in claim 1, wherein the agitator comprises an actuated element submerged within the coolant and opposing the electronic device.

4. The immersion cooled electronic arrangement as recited in claim 3, wherein the actuated element includes a first actuated element and a second actuated element, the second actuated element being disposed below the first actuated element relative to gravity.

5. The immersion cooled electronic arrangement as recited in claim 3, wherein the actuated element is movable between a first position and a second position, the first position and second position defining a movement axis intersecting the electronic device.

6. The immersion cooled electronic arrangement as recited in claim 1, wherein the agitator comprises an actuator, the actuator being submerged within the coolant.

7. The immersion cooled electronic arrangement as recited in claim 6, wherein the actuator is a first actuator and further including a second actuator, the second actuator being disposed below the first actuator relative to gravity.

8. The immersion cooled electronic arrangement as recited in claim 1, wherein the electronic devices comprises a printed circuit board (PCB) fixed relative to the housing, a solid-state switch device connected to the PCB, and a heat exchanger connected to the solid-state switch device and opposing the agitator.

9. The immersion cooled electronic arrangement as recited in claim 1, further comprising an ullage space defined between a liquid surface of the coolant and the housing, a condenser disposed within the ullage space, and a heat exchanger disposed on an exterior of the housing.

10. The immersion cooled electronic arrangement as recited in claim 1, wherein the sensor includes at least one of an accelerometer, a temperature transducer, and a pressure transducer.

11. The immersion cooled electronic arrangement as recited in claim 1, wherein the coolant includes a dielectric coolant.

12. The immersion cooled electronic arrangement as recited in claim 1, wherein the agitator is separated from the electronic device by a coolant-filled gap.

13. An immersion cooled electronic arrangement, comprising:
   a sealed housing;
   a coolant contained within the housing;
   an electronic device submerged within the coolant;
   an agitator disposed within the housing;
   a control module operatively connected to the agitator, the agitator is configured to control heat transfer between the electronic device and the coolant, the control module being responsive to non-transitory machine-readable instructions to control heat transfer between the electronic device and the coolant; and
   a sensor disposed within the housing, the sensor being adapted and configured to provide a signal including information relating to a heat transfer coefficient and critical heat flux between the electronic device and the coolant,
   wherein the instructions cause the control module to:
      determine heat flux between the electronic device and the coolant;
      compare the determined heat flux with a predetermined heat flux value; and
      actuate the agitator based on comparison of the determined heat flux and the predetermined heat flux value.

14. An immersion cooled electronic arrangement, comprising:
   a sealed housing;
   a coolant contained within the housing;
   an electronic device submerged within the coolant;
   an agitator disposed within the housing;
   a control module operatively connected to the agitator, the agitator is configured to control heat transfer between the electronic device and the coolant, the control module being responsive to non-transitory machine-readable instructions to control heat transfer between the electronic device and the coolant; and
   a sensor disposed within the housing, the sensor being adapted and configured to provide a signal including information relating to a heat transfer coefficient and critical heat flux between the electronic device and the coolant,
   wherein the instructions cause the control module to actuate the agitator when a determined heat flux between the electronic device and the coolant is below a predetermined heat flux target.

15. An immersion cooled electronic arrangement, comprising:
   a sealed housing;
   a coolant contained within the housing;
   an electronic device submerged within the coolant;
   an agitator disposed within the housing;
   a control module operatively connected to the agitator, the agitator is configured to control heat transfer between the electronic device and the coolant, the control module being responsive to non-transitory machine-readable instructions to control heat transfer between the electronic device and the coolant; and a sensor disposed within the housing, the sensor being adapted and configured to provide a signal including information relating to a heat transfer coefficient and critical heat flux between the electronic device and the coolant, wherein the instructions cause the control module to actuate the agitator to generate a predetermined heat flux between the electronic device and the coolant.

16. A method of controlling heat transfer between an electronic device and coolant in an immersion cooling arrangement, the method comprising:

generating heat using an electronic device submerged within a coolant disposed within a sealed housing;

determining heat flux or a heat transfer coefficient between the electronic device and the coolant;

comparing the determined heat flux or heat transfer coefficient with a predetermined heat flux value or predetermined heat transfer coefficient;

agitating the coolant to control heat transfer between the electronic device and the coolant; and transferring the heat from the electronic device to the coolant, wherein agitating the coolant includes vibrating the agitator based on comparison of the determined heat flux or heat transfer coefficient and the predetermined heat flux value or heat transfer coefficient.

17. The immersion cooled electronics arrangement as recited in claim 4, wherein the second actuated element is operably connected to the substrate by a second actuator and is movable between a first position and a second position, the first position and second position defining a second movement axis intersecting the electronic device and parallel to the movement axis of the first actuated element.

* * * * *